United States Patent [19]

Jones et al.

[11] Patent Number: 4,782,468
[45] Date of Patent: Nov. 1, 1988

[54] LINE POWER FAILURE SCHEME FOR A GAMING DEVICE

[75] Inventors: Steven W. Jones, Wood Dale; Chandra Alifen, Hoffman Estates, both of Ill.

[73] Assignee: Bally Manufacturing Corporation, Chicago, Ill.

[21] Appl. No.: 893,577

[22] Filed: Aug. 5, 1986

[51] Int. Cl.⁴ .................... G11C 8/00; G06F 11/00; H03M 13/00; A63B 7/00
[52] U.S. Cl. .................... 365/229; 273/138; 364/900; 371/66
[58] Field of Search .................... 365/226–229; 273/138 A, 143 R; 364/481, 900, 200

[56] References Cited

U.S. PATENT DOCUMENTS

| | | | |
|---|---|---|---|
| 4,285,240 | 8/1981 | Gold | 73/462 |
| 4,535,409 | 8/1985 | Jindrick et al. | 364/481 |
| 4,582,324 | 4/1986 | Koza et al. | 273/138 A |
| 4,652,998 | 3/1987 | Koza et al. | 364/900 |
| 4,660,833 | 4/1987 | Dickinson et al. | 273/143 |

*Primary Examiner*—James W. Moffitt
*Assistant Examiner*—Melissa J. Koval
*Attorney, Agent, or Firm*—Jenner & Block

[57] ABSTRACT

A power failure scheme for a gaming device in which, upon the detection of a failure of the line power, particular processing operations are completed before power is completely lost. A regulated D.C. power supply coupled to the line power generates an interrupt having the highest priority upon detecting a failure of the line power. The main processor of the gaming device is responsive to a power fail interrupt to complete any access to a safe memory which may have been on-going at the time the interrupt was generated or to complete any state transition which was on-going at the time the interrupt was generated.

10 Claims, 4 Drawing Sheets

4,782,468

1

LINE POWER FAILURE SCHEME FOR A GAMING DEVICE

TECHNICAL FIELD

The present invention relates to a line power failure scheme for a gaming device and more particularly to such a scheme in which particular processing operations of the gaming device are completed before power for the device is completely lost upon failure of the line power.

BACKGROUND OF THE INVENTION

Known gaming devices include computer controls with memories such as a RAM for storing data indicative of a currently on-going gaming transaction. Metered data representing, for example, the total number of coins input to the gaming device or the total number of coins paid out from the device, is also stored in the gaming device's RAM. For power, such gaming devices typically use the A.C. line voltage of the casino or establishment in which the gaming device is installed. To ensure that data written into the RAM is not lost if the line power fails, battery backup circuits for the RAM are typically employed. However, if the computer is interrupted while it is accessing the RAM to update information stored therein, the updated information may be lost. As a result, the metered data stored in the RAM may not be accurate. Further, if the line power is lost when the computer is in the process of changing the state of the gaming device such that the device is in a state transition, upon the restoration of power, the gaming device may be in an indefinite state with the result that the device will be inoperative.

SUMMARY OF THE INVENTION

In accordance with the present invention, the disadvantages of prior gaming devices as discussed above, have been overcome. The gaming device of the present invention employs a line power failure scheme in which particular processing operations of the gaming device are completed before power for the device is completely lost upon failure of the line power.

The gaming device of the present invention includes a regulated D.C. power supply which is powered by the A.C. line voltage of the building in which the device is installed. Upon determining a failure of the line power, the regulated D.C. power supply generates an interrupt of the highest priority, the interrupt being coupled to the main processor of the gaming device. There is approximately 10 to 21 msec. between the time the power failure interrupt is generated and the time power is completely lost. During this time and in response to the power failure interrupt, the game processor checks to determine whether an access to a safe portion of the device's RAM is ongoing. If it is, the processor completes the access so that data updating the safe RAM is not lost. If an access to the safe RAM was not ongoing at the time the interrupt was generated, or if such an access was on-going but has since been completed by the processor, the processor determines whether the gaming device is in a stable state, i.e., not in a state transition. If the gaming device is in a stable state, the processor halts its operation. However, if the gaming device is in a state transition, the processor completes the state transition and thereafter halts its operation so that upon the restoration of power, the gaming device will be in an identifiable and stable state. It is noted that because a state transition typically takes only 1 msec. to complete, the processor has sufficient time to complete both a safe RAM access and a state transition between the time the power failure interrupt is generated and the time power is completely lost.

These and other objects and advantages of the invention, as well as details of an illustrative embodiment, will be more fully understood from the following description and the drawings.

BEST MODE FOR CARRYING OUT THE INVENTION

Figure 1:
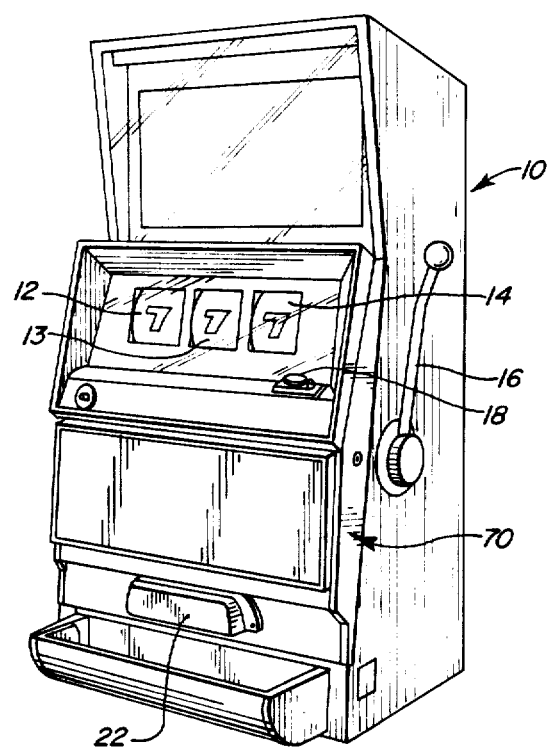
FIG. 1 is a perspective view of a gaming device employing the line power failure scheme of the present invention.
Figure 2:
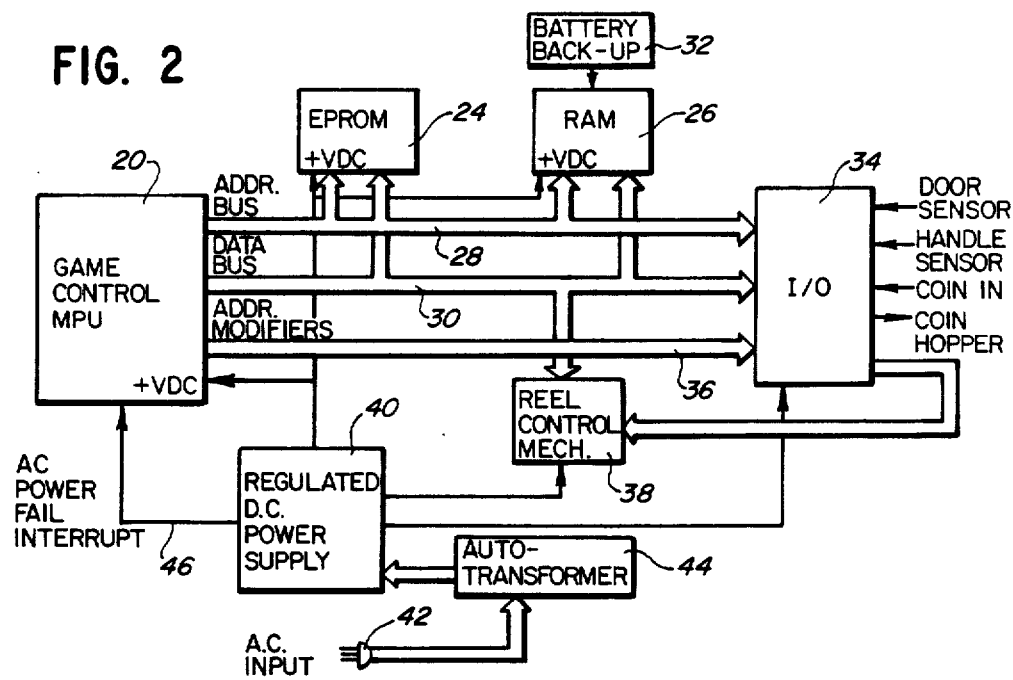
FIG. 2 is a block diagram of the gaming device of FIG. 1 employing the line power failure scheme of the present invention.

A gaming device 10 employing the line power failure scheme of the present invention is shown in FIG. 1. The gaming device 10 includes three symbol bearing reels 12, 13 and 14 which are controlled to rotate in response to the pulling of a handle 16 after a coin is inserted into a coin input slot 18. The gaming device 10 includes a game control microprocessor 20, as shown in FIG. 2, which stops the reels 12-14 to display randomly selected symbols along a win line. If the symbols displayed along the win line form a winning combination, the microprocessor 20 causes a coin hopper to payout, through a payout chute 22, a number of coins or tokens.

The game control microprocessor 20, shown in FIG. 2, is preferably a Motorola 68,000 processor. The processor 20 controls the operation of the gaming device 10 in accordance with software and data stored in an EPROM 24 and RAM 26. The EPROM 24 and RAM 26 are each coupled to the processor 20 by an address bus 28 and a data bus 30. To ensure that no data stored in the RAM 26 is lost during a power failure, the RAM 26 is coupled to a battery backup circuit 32. The game control microprocessor 20 is also coupled to various input sensors and devices as well as the coin hopper through an Input/Output board 34 which is coupled to the processor 20 through the address and data buses 28 and 30 and an address modifier line 36. In order to address the Input/Output board 34, the game control microprocessor 20 must output the correct address modifiers for the Input/Output board on line 36 as well as the address for the Input/Output board on the address bus 28. The game control microprocessor 20 controls each of the reels 12-14 through a reel control mechanism 38 which is coupled to the data bus 30 to receive data therefrom. The reel control mechanism 38 is also coupled to the Input/Output board 34 which is responsive to the microprocessor 20 for selecting the reel control mechanism associated with a particular one of the reels 12, 13 or 14 to receive data from the bus 30.

The gaming device 10 is powered by a regulated D.C. power supply 40 which provides +5 volts D.C. to each of the processor 20, EPROM 24, RAM 26, Input/Output board 34 and reel mechanism 38. The regulated D.C. power supply 40 is coupled to the line voltage of the building in which the gaming device is installed through a standard three prong connector 42 and an auto transformer 44. The regulated D.C. power supply 40 is also coupled to the game control microprocessor 20 through an A.C. power failure interrupt line 46.

In the event that the line power coupled to the gaming device 10 through the connector 42 fails, the regulated D.C. power supply 40 generates on line 46 a power failure interrupt having the highest priority. The microprocessor 20 is responsive to a power failure interrupt on line 46 to complete various processing operations which may have been on-going at the time the interrupt is received before power is completely lost, there being between 10 to 21 msec. between the time the power failure interrupt is generated and the time that power is completely lost. One such processing operation is the accessing of a portion of the RAM 26 designated as a safe RAM. The safe RAM portion of the RAM 26 is such that access thereto for reading data is accomplished by a standard memory read operation of the microprocessor 20. However, in order to write to the safe portion of the RAM 26, the microprocessor 20 must first unlock the safe RAM by accessing a key circuit, not shown. The accessing of the key permits the microprocessor 20 to write one byte or word into the safe RAM portion of the RAM 26 during a limited period of time. The safe RAM portion of the RAM 26 stores the metered data such as the total number of coins input to the gaming device and the total number of coins paid out from the device as well as the current state of the gaming device. Other portions of the RAM 26 are used as a scratch pad memory.

Figure 3:
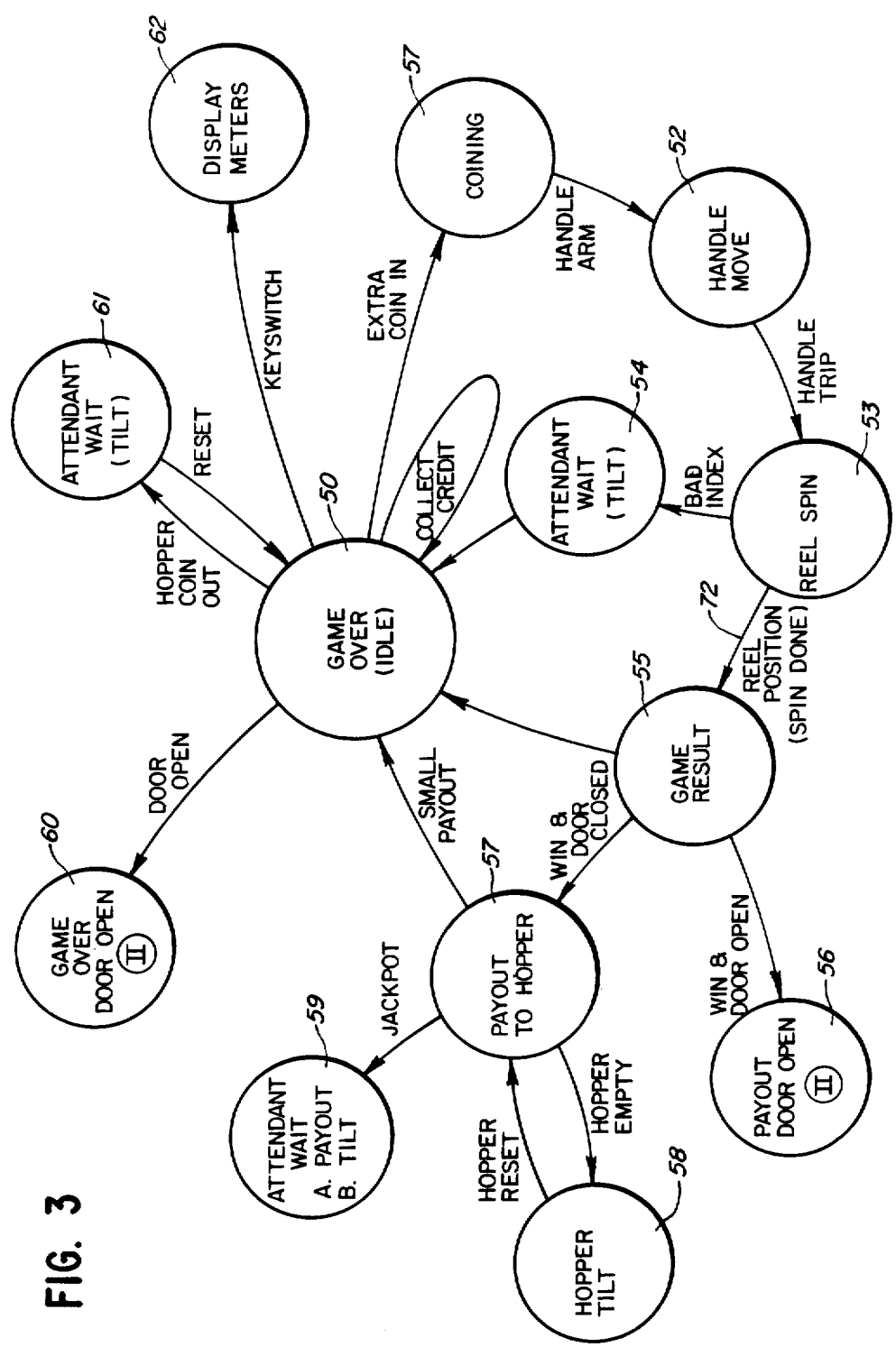
FIG. 3 is a state diagram illustrating the various states of the gaming device of FIG. 1 with its door closed.
Figure 4:
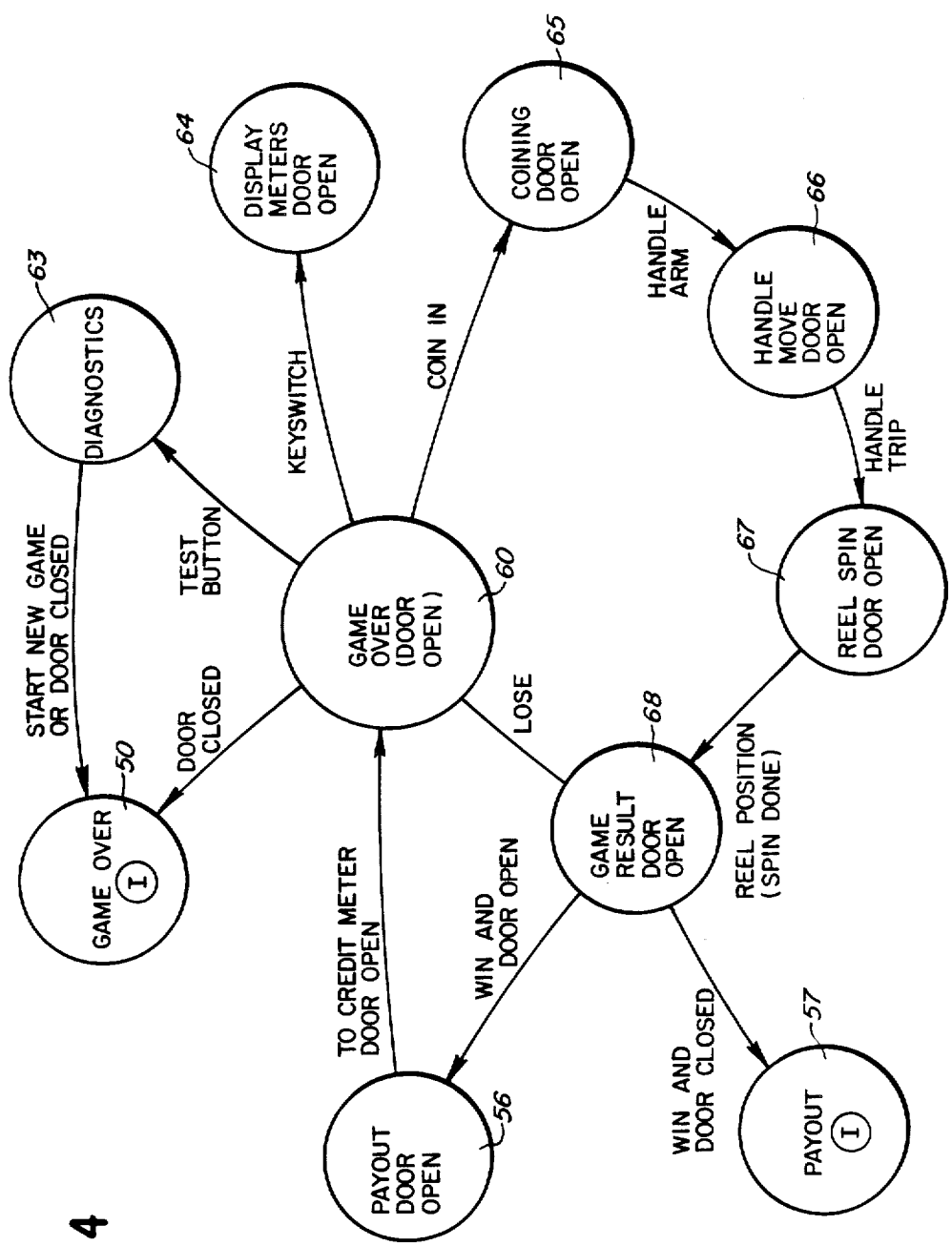
FIG. 4 is a state diagram illustrating the various states of the gaming, device of FIG. 1 with its door open.

The game control microprocessor 20 also completes any on-going state transition which may have been interrupted by a power failure interrupt on line 46. The gaming device 10 includes a number of game states 50-68 as illustrated in the state diagrams of FIG. 3 and FIG. 4. The game states depicted in FIG. 3 are illustrative of the states of the gaming device 10 with the door 70 of the device closed; whereas, the states depicted in FIG. 4 are illustrative of the gaming device states when the door 70 is open. Each state transition is represented by an arrow such as the arrow 72, connecting the two states 53 and 55.

Figure 6:
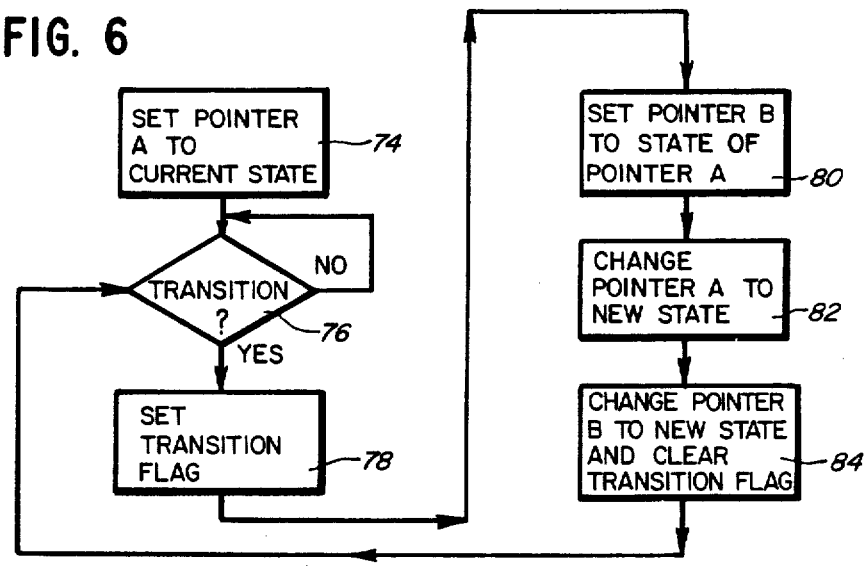
FIG. 6 is a flowchart illustrating the process of changing states in the gaming device.

In order to change states, the microprocessor 20 operates as follows with reference to FIG. 6. As an example, assume that the reels 12-14 of the gaming device 10 are spinning so that the gaming device is in the reel spin state 53 shown in FIG. 3. In order to change from state 53 to state 55 when the reels have stopped spinning, the processor 20, at block 74, sets a pointer A to the current state, i.e., the reel spin state 53. When the transition is to occur as determined by the processor 20 at block 76, the processor at block 78 sets a transition flag to provide an indication that a transition is on-going. Thereafter, at block 80, the processor 20 sets a pointer B to the state of pointer A which is at that time the reel spin state 53. The processor 20, at block 82, next changes the pointer A to the new state, the game result state 55 as it jumps to state 55. Thereafter, at block 84, the processor 20 sets the pointer B to the new state, the game result state 55 and clears the transition flag.

Figure 5:
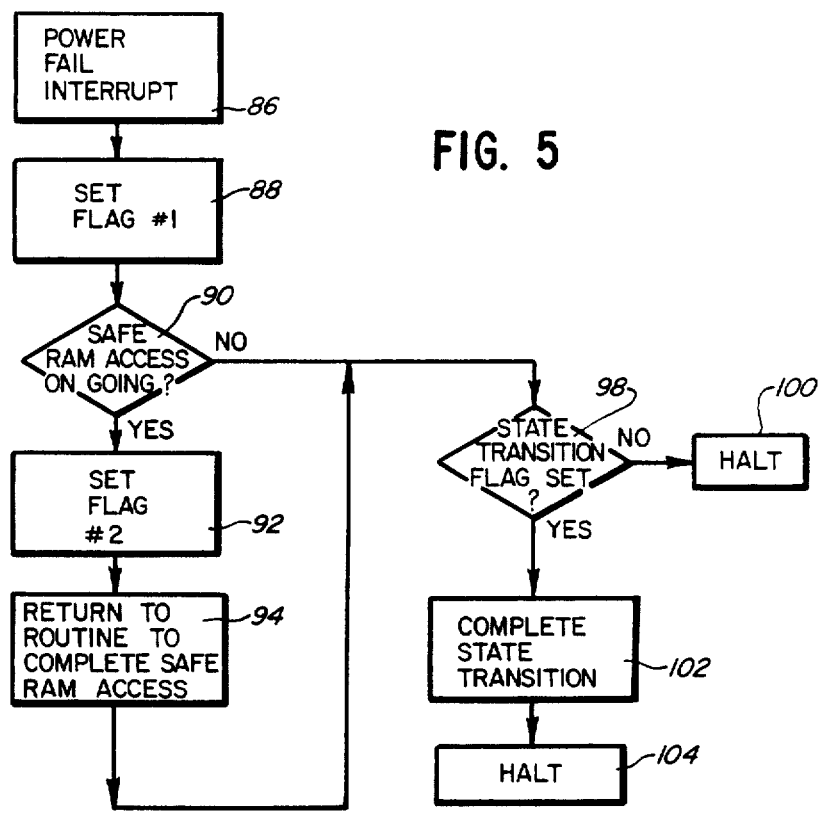
FIG. 5 is a flowchart illustrating the power failure scheme of the present invention.

In order to prevent data from being lost when the processor 20 is accessing the safe RAM portion of the RAM 26 and the line power fails, and to ensure that the gaming device 10 is in an identifiable and stable state, i.e., one of states 50-68, the processor 20 responds to the receipt of a power failure interrupt at a block 86 from the regulated power supply 40, as follows with reference to FIG. 5. The processor 20 first sets a power failure interrupt flag at block 88 and thereafter, at block 90, determines whether a safe RAM access was on-going at the time the interrupt was received. If a safe RAM access was on-going, the processor, at block 92, sets a second flag and at block 94 returns to the safe RAM access software routine to complete the safe RAM access interrupted by the receipt of the power failure interrupt at block 86. After the safe RAM access has been completed, or if it was determined at block 90 that a safe RAM access was not on-going at the time of the interrupt, the processor 20, at block 98, determines whether the state transition flag is set, indicating that a state transition is or was on-going. If not, the processor at block 100 halts its operation. If the state transition flag is set, at block 102 the processor completes the state transition routine illustrated in FIG. 6 and thereafter, at block 104, halts its operation.

Since the processor 20 has approximately 10 to 21 msec. from the time that the power failure interrupt is generated until power for the gaming device 10 is completely lost, the processor has ample time to complete a safe RAM access or state transition which, for example, typically takes less than 1 msec. to perform. Because the processor can complete a safe RAM access or state transition before power is completely lost, the power failure scheme of the present invention prevents loss of data and ensures that the processor will be in an identifiable state, and thus operable, upon the restoration of power.

We claim:

1. In a gaming device having processing means for controlling the operation of the gaming device including the accessing of a safe memory which can be accessed by the processing means for only a limited period of time using a key, said processing means being powered by a regulated power supply operating on line power for the building in which the gaming device is installed, a line power failure system implementation comprising:

power fail interrupt means responsive to a failure of the line power for interrupting the current control operation of the processing means;

means for determining whether the accessing of the safe memory was interrupted by said power fail interrupt means; and means responsive to a determination that the accessing of the safe memory was interrupted for causing said processing means to complete said interrupted safe RAM access.

2. The gaming device of claim 1 wherein said power fail interrupt means generates an interrupt coupled to said processing means, said interrupt having the highest priority.

3. The gaming device of claim 2 further including means responsive to said interrupt for setting a power failure flag to provide a record that a power failure occurred.

4. The gaming device of claim 3 further including means for setting a flag indicating that a safe RAM access was on-going when the power failure occurred to provide a record thereof.

5. The gaming device of claim 1 wherein said gaming device operates in a plurality of states and in a state transition when moving from one state to another state; and further including means responsive to a determination that the accessing of said safe memory was not interrupted for determining whether a state transition was interrupted by said power fail interrupt means; and means responsive to a determination that a state transition was interrupted for causing said processing means to complete the transition from said one state to another and to thereafter halt.

6. In a gaming device having a plurality of game states and a processing means for controlling the operation of the gaming device including the transition of the gaming device from one state to another state, said processing means being powered by a regulated power supply operating on line power for the building in which the gaming device is installed, a line power failure system implementation comprising:

power fail interrupt means responsive to a failure of the line power for interrupting the current control operation of the processing means;

means for determining whether a transition from one state to another state was interrupted by said power fail interrupt means; and means responsive to a determination that a transition from one state to another state was interrupted for causing said processing means to complete the transition from said one state to said other state and to thereafter halt.

7. The gaming device of claim 6 wherein said power fail interrupt means generates an interrupt coupled to said processing means, said interrupt having the highest priority.

8. The gaming device of claim 6 further including means for setting a power failure flag to provide a record that a power fail occurred.

9. In a gaming device having a plurality of game states and a processing means for controlling the operation of the gaming device including the accessing of a safe memory which can be accessed by the processing means for only a limited period of time using a key, said processing means being powered by a regulated power supply operating on line power for the building in which the gaming device is installed, a method to prevent loss of data in the event of a line power failure comprising:

generating an interrupt having the highest priority to interrupt the current control operation of the processing means in response to a failure of the line power;

setting a power fail flag in response to said interrupt to provide a record thereof;

determining whether the accessing of the safe memory was on-going when said interrupt was generated; and completing said safe memory access before power is completely lost if a safe memory access is determined to be on-going.

10. In a gaming device having a plurality of game states and a processing means for controlling the operation of the gaming device including the transition of the gaming device from one state to another state, said processing means being powered by a regulated power supply operating on line power for the building in which the gaming device is installed, a method to ensure that said gaming device is in a definite state upon the restoration of power after a power failure comprising:

generating an interrupt having the highest priority to interrupt the current control operation of the processing means in response to a failure of the line power;

setting a power fail flag in response to said interrupt to provide a record that a power failure occurred;

determining whether the gaming device was in a transition between one state and another state when said interrupt was generated; and completing said transition from said one state to said other state before power is completely lost if it is determined that the gaming device was in a transition; and thereafter halting operation.

* * * * *